United States Patent
Kumari et al.

(10) Patent No.: US 9,953,897 B2
(45) Date of Patent: Apr. 24, 2018

(54) FLUID-FILLED MICROCHANNELS

(71) Applicant: HEWLETT PACKARD ENTERPRISE DEVELOPMENT LP, Houston, TX (US)

(72) Inventors: Niru Kumari, Palo Alto, CA (US); Sergio Escobar-Vargas, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/216,969

(22) Filed: Jul. 22, 2016

(65) Prior Publication Data
US 2018/0025964 A1    Jan. 25, 2018

(51) Int. Cl.
*H01L 23/498* (2006.01)
*H01L 23/473* (2006.01)

(52) U.S. Cl.
CPC ...... *H01L 23/473* (2013.01); *H01L 23/49894* (2013.01)

(58) Field of Classification Search
CPC .................. H01L 23/473; H01L 23/49894
See application file for complete search history.

(56) References Cited

U.S. PATENT DOCUMENTS

| | | | | |
|---|---|---|---|---|
| 5,901,037 | A * | 5/1999 | Hamilton | F28F 3/12 165/80.4 |
| 7,571,618 | B2 * | 8/2009 | Dessiatoun | H01L 23/473 165/80.1 |
| 8,833,435 | B2 * | 9/2014 | Determan | F28D 15/0266 165/104.25 |
| 2012/0049233 | A1 * | 3/2012 | Yuan | H01L 25/167 257/99 |
| 2016/0302867 | A1 * | 10/2016 | Willyard | A61B 18/18 |
| 2016/0359002 | A1 * | 12/2016 | Nygaard | H01L 21/78 |

* cited by examiner

*Primary Examiner* — Long Pham
(74) *Attorney, Agent, or Firm* — Brooks, Cameron & Huebsch, PLLC

(57) ABSTRACT

A device comprises a first layer of a die. The first layer comprises a microchannel. The microchannel is partially filled with a liquid and partially filled with air. The die also comprises a second layer. The second layer of the die seals a top of the microchannel of the first layer.

21 Claims, 6 Drawing Sheets

FLUID-FILLED MICROCHANNELS

BACKGROUND

A computing device may generate heat. Various devices may be used to dissipate the heat to ensure that the computing device does not overheat.

BRIEF DESCRIPTION OF THE DRAWINGS

Certain examples are described in the following detailed description and in reference to the drawings, in which.

DETAILED DESCRIPTION

As integrated circuit chips shrink in size, increase in density, and the distance between transistors decreases, hot spots, i.e. concentrated areas of heat, referred to as hot spots, become increasingly problematic. In general, it is difficult to cool these hot spots without overcooling the entire chip. The techniques of this disclosure may reduce hot spots on a chip without overcooling the chip.

More particularly, the techniques of this disclosure are directed to creating a closed loop liquid-filled microchannels within a chip. The microchannels are etched out of a layer of a chip. In some examples, the layer comprising the microchannels may comprise a silicon layer or a silicon dioxide layer. The silicon layer may be bonded onto a silicon dioxide layer. The microchannels are filled with a dielectric fluid and the channels are sealed to prevent leakage.

When the chip is in operation, and a hot spot becomes heated, the hot spot transfers its heat to the fluid, and creates a thermal gradient within the fluid. The thermal gradient creates movement within the fluid, which causes the heat to be distributed to cooler parts of the die. By distributing heat away from the hot spots, the chip does not have to be over cooled and the heat distribution within the chip is more even. In some examples, the chip may include a piezo-electric pump embedded within the channels to increase flow velocity of the fluid.

Figure 1:
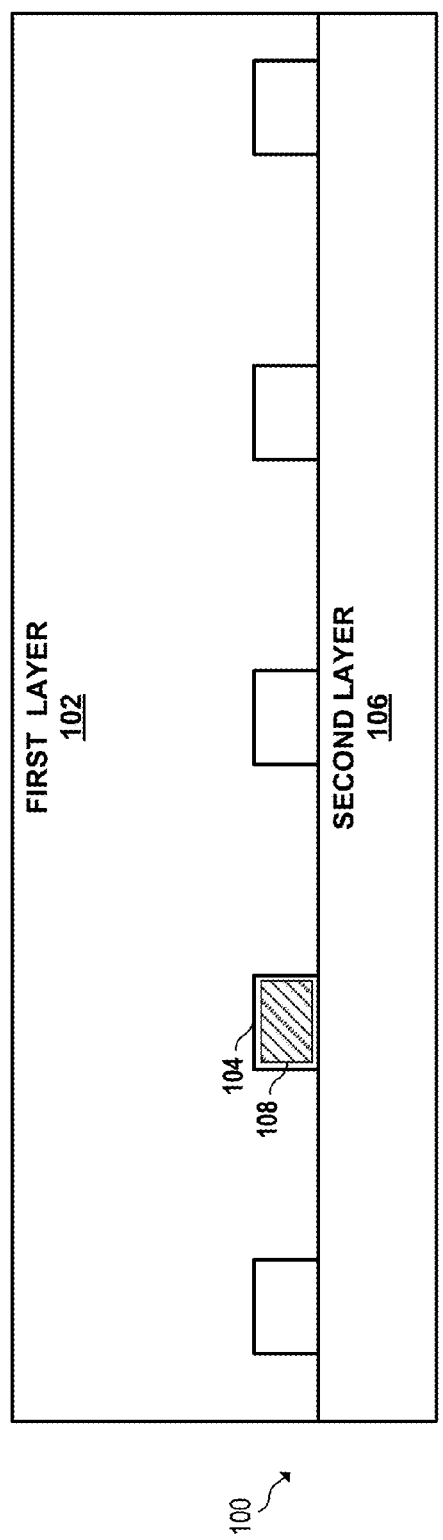
FIG. 1 is a conceptual diagram of an example device that may comprise fluid-filled microchannels.

FIG. 1 is a cross-sectional diagram of an example device comprising fluid-filled microchannels. In the example of FIG. 1 illustrates a device comprising an example die 100. Die 100 may comprise a computing device, integrated circuit (IC), a memory, or any other microelectronic device. In various examples, at least one fabrication device semiconductor fabrication devices (e.g. photolithography devices, etching devices, ion implantation systems, annealing devices, the like, or any combination thereof) may fabricate die 100. Die 100 comprises a first layer 102, and a second layer 106. Device 100 may be fabricated using microelectronic device manufacturing methods and/or devices known to those skilled in the art.

In some examples, first layer 102 may comprise a silicon layer, and second layer 106 may comprise a silicon dioxide layer or vice versa. First layer 102 and second layer 106 may comprise a same material in some examples. For instance, first layer 102 and second layer 106 may both comprise a silicon layer or a silicon dioxide layer.

Device 100 may comprise a silicon die. Using lithography techniques, such a wet or dry etching, microchannels 104 may be etched into first layer 102. Once microchannels 104 have been etched, microchannels 104 may be filled with a fluid 108 (illustrated with diagonal hashing), such as a dielectric fluid. In various examples, fluid 108 may comprise deionized water. In various examples, fluid 108 may comprise a dielectric fluid other than deionized water, which may be selected based on a maximum temperature of the die.

During the manufacturing process, a second layer 106 may be bonded to first layer 102 to seal microchannels 104, i.e. to contain the fluid contained disposed within microchannels 104. In some examples, Microchannel 104 may have a constant depth within first layer 102. Microchannel 104 may also have a constant width and depth within first layer 102.

In various examples, second layer 106 may be located on top of an active microelectronic device layer (not pictured). The microelectronic device layer may comprise devices such as metal oxide semiconductor field effect transistors (MOSFETs) and the like. The active device layer may be coupled physically and electrically with a back end layer (not pictured). The back end layer may comprise metal layers which are used to electrically couple the devices of the active device layer.

During operation of die 100, the devices of the active device layer generate heat. Some areas of the active device layer may become much hotter than other areas. Concentrated areas of the active device layer may be referred to as "hot spots."

As described above, the active device layer is bonded with second layer 106, and second layer 106 is bonded with microchannels 104. The hot spots generated by the operation of the devices in the active layer cause temperature gradients within fluid 108 of microchannels 104. The temperature gradient within microchannels 104 may cause of fluid 108 to flow within microchannels 104. More particularly, the temperature gradient causes fluid having a higher temperature to move to areas within microchannels 104 that have a lower temperature. Similarly, the temperature gradient causes fluid having a lower temperature to fill the heated regions of microchannels 104 that the warmer fluid previously occupied.

Allowing the temperature gradient to cause cooler regions of the fluid to flow to warmer areas of the die, and by causing warmer regions of the fluid to flow to cooler areas of the die, the techniques of this disclosure may reduce hot spots on the die. By reducing or eliminating the heat buildup associated with hot spots on the die, the techniques of this disclosure may avoid having to overcool the die. Avoiding overcooling of the die may reduce cooling system complexity and cost, as examples.

Thus, FIG. 1 represents an example of a device comprising a first (102) of a die (100). First layer 102 comprises a microchannel 104 that is filled with a dielectric fluid 108. First layer 102 is sealed with a second layer second layer 106 of the die.

Figure 2:
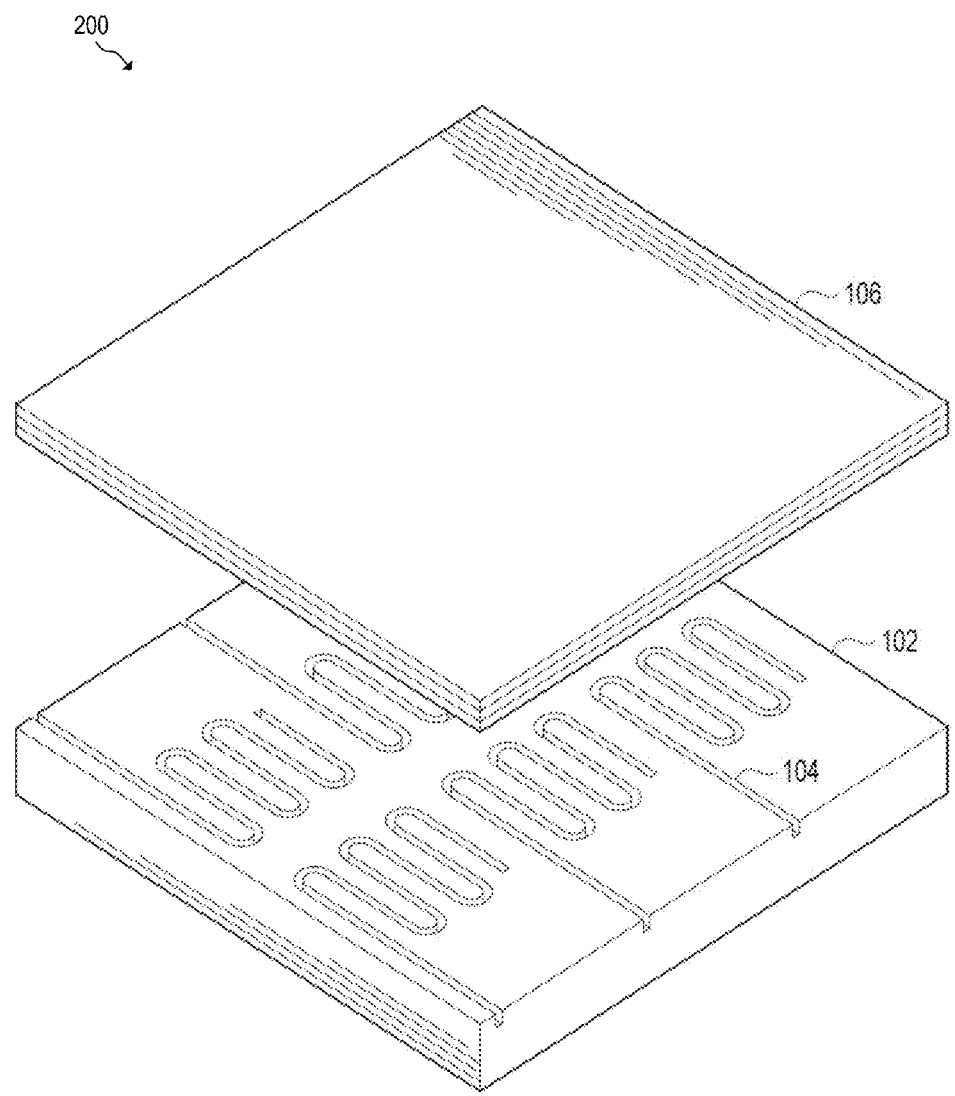
FIG. 2 is another conceptual diagram of an example device that may comprise fluid-filled microchannels.

FIG. 2 is another cross-sectional diagram of a device comprising fluid-filled microchannels. In the example of FIG. 1, die 100 of FIG. 1 is illustrated from a cutaway isometric perspective. The orientation of second layer 106 and first layer 102 is reversed relative to FIG. 1. That is, second layer 106 is illustrated as the topmost layer, and first layer 102 is illustrated as the bottommost layer in FIG. 1.

FIG. 2 illustrates a plurality of microchannels 104 in greater detail relative to the illustration of FIG. 1. In the example of FIG. 2, microchannel 104 has a serpentine layout that traverses the interface between first layer 102 and second layer 106. As defined herein, a serpentine layout may be defined as a microchannel that curves at various points to create a series of parallel segments within first layer 102.

In various examples, microchannels 104 may be a closed loop system. That is, microchannels 104 may not be coupled with a pump, and fluid 108 may move based on the temperature gradient created within fluid 108. In some other examples, one or more piezo-electric pumps may be embedded within microchannels 104. Each piezo-electric pump may actuate to cause fluid 108 to flow through one or more of microchannels 104. The piezo-electric pump may be electrically coupled with a power source disposed within die 100. In some examples, the power source may be located in an active device layer of die 100. A piezo-electric pump may actuate in response to detection of an increased temperature or in response to detecting a hotspot of die 100.

Figure 3:
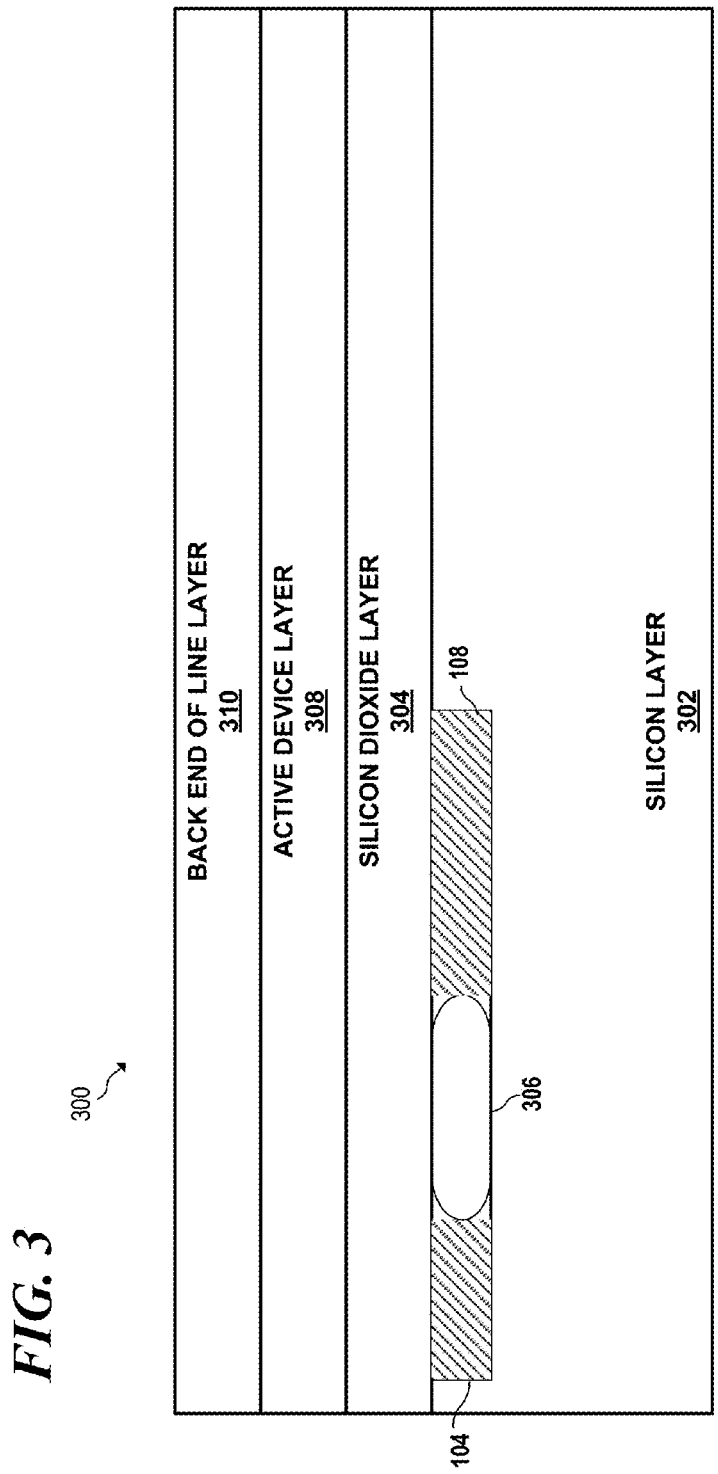
FIG. 3 is a conceptual diagram of an example device that may comprise fluid-filled microchannels.

FIG. 3 is another cross-sectional diagram of an example die 300 comprising fluid-filled microchannels. FIG. 3 illustrates an example of a more detailed perspective of a microchannel that contains a liquid as well as air. Die 300 is upside down relative to the orientation illustrated in FIG. 1. In the example of FIG. 3, microchannel 104 is embedded in a silicon layer 302 (i.e. a first layer). Silicon layer 302 is bonded with a silicon dioxide layer 304 (i.e. a second layer).

Silicon dioxide layer 304 is coupled to an active device layer 308, which may be roughly co-planar with silicon layer 302. Active device layer 308 may comprise devices such as metal oxide semiconductor field effect transistors (MOSFETs) and/or the like. Active device layer 308 may be coupled physically and electrically with back end of line (BEOL) layer 310. Active device layer 308 may be roughly co-planar with BEOL layer 310. BEOL layer 310 may comprise metal layers which are used to electrically couple the devices of the active device layer.

Microchannel 104 is filled with a fluid 108. Microchannel 104 is illustrated larger than actual size for ease of visualization. Fluid 108 is illustrated with diagonal hashing. In the example of FIG. 3, microchannel 104 is also illustrated as being partially filled with air 306. Air 306 creates a meniscus (illustrated with curved edges) within microchannel 104. The meniscus may move within microchannel 104 responsive to a temperature gradient caused by heating of active device layer 308.

Thus, FIG. 3 illustrates an example device 300 comprising a first layer (e.g. silicon layer 302) of a die 300. The silicon layer comprises a microchannel 104. Microchannel 104 is partially filled with a liquid 108 and partially filled with air 306. Die 300 also comprises a second layer (e.g. silicon dioxide layer 304) that is bonded to first layer (302). In various examples, liquid 108 may comprise deionized water.

Figure 4:
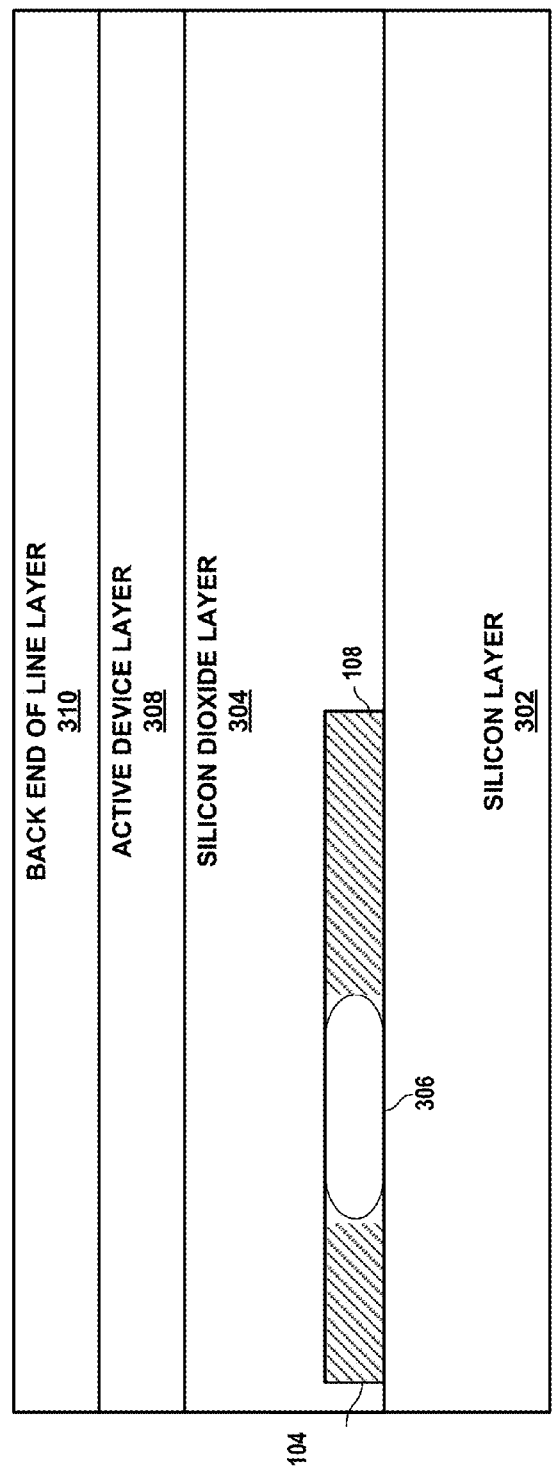
FIG. 4 is a flowchart of an example method for fabricating a device comprising fluid-filled microchannels.

FIG. 4 is another cross-sectional diagram of a die 400 comprising fluid-filled microchannels. FIG. 4 illustrates an example of a more detailed perspective of a die comprising a microchannel that contains a liquid as well as air. The example of FIG. 4 is upside down relative to the orientation illustrated in FIG. 1. In the example of FIG. 4, die 400 comprises a silicon layer 302. Microchannel 104 is embedded in a silicon dioxide layer 304 (i.e. a second layer). Silicon layer 302 is bonded with a silicon dioxide layer 304 (i.e. a second layer).

Silicon dioxide layer 304 is coupled to an active device layer 308, which may be roughly co-planar with silicon layer 302. Active device layer 308 may be coupled physically and electrically with back end of line (BEOL) layer 310.

Microchannel 104 is filled with a fluid 108. Microchannel 104 is illustrated larger than actual size for ease of visualization. Fluid 108 is illustrated with diagonal hashing. In the example of FIG. 4, microchannel 104 is also illustrated as being partially filled with air 306. Air 306 creates a meniscus (illustrated with curved edges) within microchannel 104. The meniscus may move within microchannel 104 responsive to a temperature gradient caused by heating of active device layer 308.

Thus, FIG. 4 illustrates an example device comprising a first layer (i.e. silicon dioxide layer 304) of a die 400. The first layer comprises a microchannel 104. Microchannel 104 is partially filled with a liquid 108 and partially filled with air 306. Die 100 also comprises a second layer (e.g. silicon layer 302) that is bonded to the first layer (e.g. silicon dioxide layer 304). In various examples, liquid 108 may comprise deionized water.

Figure 5:
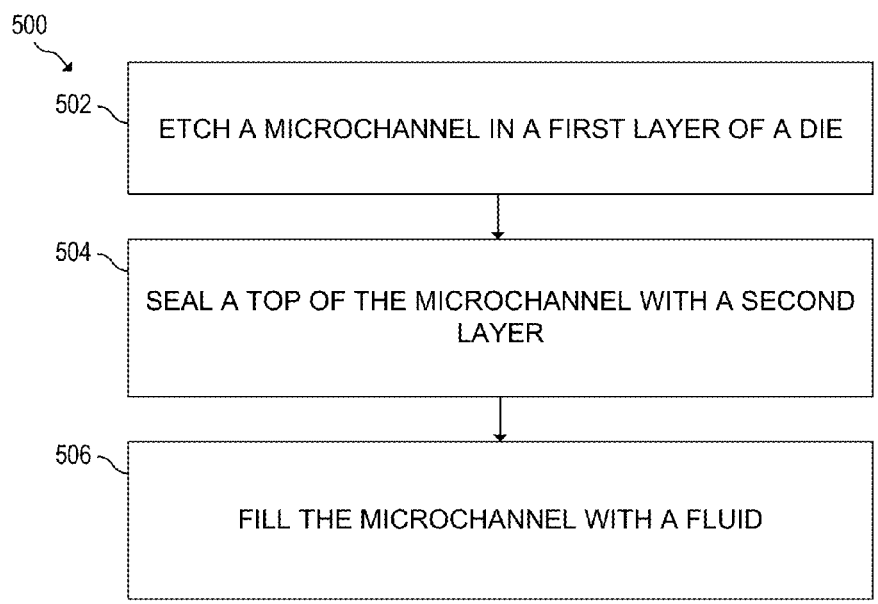
FIG. 5 is a flowchart of an example method for fabricating a device comprising fluid-filled microchannels.
Figure 6:
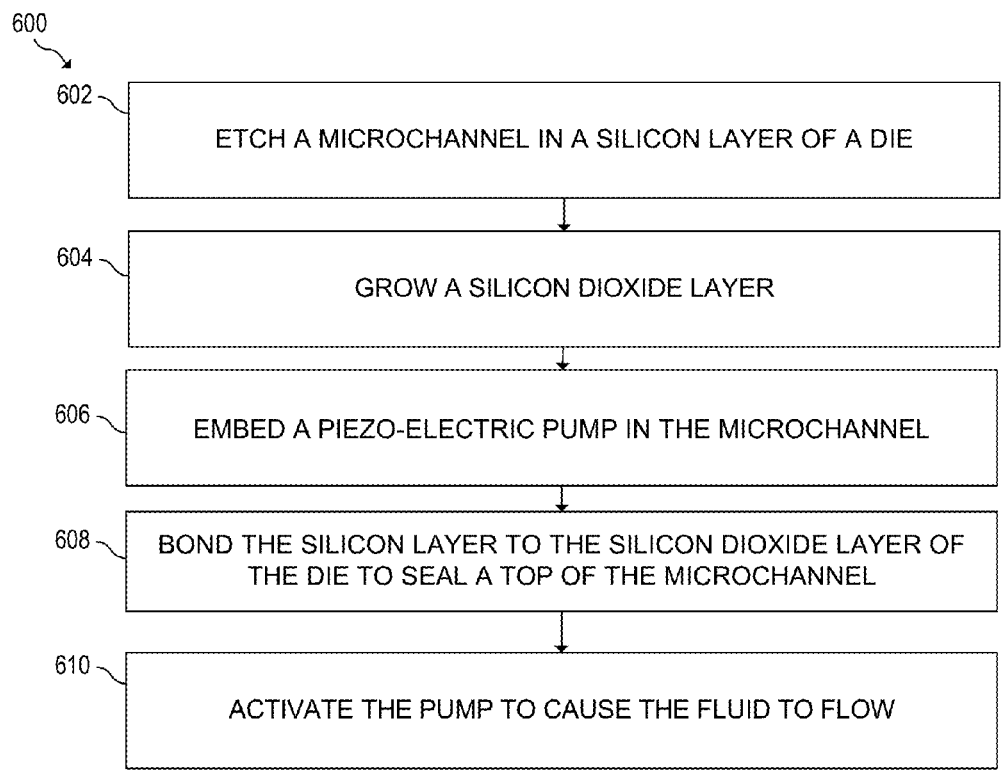
FIG. 6 is another flowchart of an example method for fabricating a device comprising fluid-filled microchannels.

FIG. 5 is a flowchart of an example method for fabricating a liquid-based heat spreader. FIG. 5 illustrates method 500. In various examples, at least one fabrication device semiconductor fabrication devices (e.g. photolithography devices, etching devices, ion implantation systems, annealing devices, the like, or any combination thereof) may perform the method 500. In alternate examples of the present disclosure, one or more blocks of method 500 may be executed substantially concurrently or in a different order than shown in FIG. 5. In alternate examples of the present disclosure, method 500 may include more or fewer blocks than are shown in FIG. 5. In some examples, one or more of the blocks of method 500 may, at certain times, be ongoing and/or may repeat.

Method 500 may start at block 502. At block 502, the at least one fabrication device may etch a microchannel, such as microchannel 104 (FIG. 1) in a silicon layer (e.g. first layer 102) of a die (e.g. die 100). At block 504, the at least one fabrication device may seal microchannel 104 of first layer 102 with a second layer (e.g. second layer 106) of the die. At block 506, a device may fill the microchannel with a fluid.

In various examples, the first layer may comprise a silicon layer, and the second layer may comprise a silicon dioxide layer. To seal the first layer, the fabrication device(s) may bond the second layer to the first layer. In various examples, the first layer and the second layer may be of a same material, e.g. an oxide or a silicon dioxide, and the first and second layers may comprise the oxide or silicon dioxide layer.

In various examples, the fluid that fills the microchannel may comprise a dielectric fluid. In various examples, the microchannel may have a serpentine layout as illustrated in FIG. 2. In various examples, the microchannel may comprise a closed loop system (i.e. a system that does not interact with any other components, such as a pump, to circulate the fluid) that encloses the fluid.

FIG. 5 is a flowchart of an example method for fabricating a liquid-base heat spreader. FIG. 5 illustrates method 500. In various examples, at least one fabrication device semiconductor fabrication devices (e.g. photolithography devices, etching devices, ion implantation systems, annealing devices, the like, or any combination thereof) may perform method 500. In alternate examples of the present disclosure, one or more blocks of method 500 may be executed substantially concurrently or in a different order than shown in FIG. 5. In alternate examples of the present disclosure, method 500 may include more or fewer blocks than are shown in FIG. 5. In some examples, one or more of the blocks of method 500 may, at certain times, be ongoing and/or may repeat.

Method 500 may start at block 502. At block 502, the at least one fabrication device may etch a microchannel, such as microchannel 104 (FIG. 1) in a silicon layer (e.g. first layer 102 or silicon layer 302) of a die (e.g. die 100). At block 504, the at least one fabrication device may grow a silicon dioxide layer, e.g. second layer 106 or silicon dioxide layer 304. At block 506, the at least one fabrication device may embed a piezo-electric pump within the microchannel. The piezo-electric pump may be coupled to a power source in various examples.

At block 508, the at least one fabrication device may cause growth of a silicon dioxide layer (e.g. second layer 106 or silicon dioxide layer 304). At block 510, the at least one fabrication device may cause the silicon layer to bond to the silicon dioxide layer of the die. Bonding the silicon layer to the silicon dioxide layer may cause sealing of a top of the microchannel of the die. At block 512, power supplied to the piezo-electric pump may cause the pump, when activated, to cause the fluid within the microchannel to flow.

The invention claimed is:

1. A method comprising:
   etching a microchannel in a first layer of a die;
   sealing the microchannel of the first layer with a second layer of the die, wherein the microchannel sealed by the first layer and the second layer is isolated such that the fluid is trapped within the microchannel; and
   filling the microchannel with a fluid, wherein the microchannel causes the fluid to flow through the microchannel responsive to a temperature gradient created along the microchannel.

2. The method of claim 1, wherein the first layer comprises a silicon layer and the second layer comprises a silicon dioxide layer, and
   wherein sealing the first layer comprises bonding the second layer to the first layer.

3. The method of claim 1, wherein the first layer and the second layer are of a same material.

4. The method of claim 1, comprising:
   embedding a piezo-electric pump within the microchannel.

5. The method of claim 3, comprising: activating the pump, wherein activating the pump causes the fluid to flow.

6. The method of claim 1, wherein the fluid comprises a dielectric fluid.

7. The method of claim 1, wherein the microchannel has a serpentine layout.

8. The method of claim 1, wherein the microchannel comprises a closed loop system that encloses the fluid.

9. A device comprising:
   a first layer of a die, the first layer comprising a microchannel filled with a fluid, wherein the microchannel causes the fluid to flow through the microchannel responsive to a temperature gradient created along the microchannel; and
   a second layer of the die, wherein the second layer seals a top of the microchannel of the first layer, wherein the microchannel sealed by the second layer is isolated such that the fluid is trapped within the microchannel.

10. The device of claim 9, wherein the device includes a piezo-eletric pump within the microchannel.

11. The device of claim 9, wherein the microchannel has a serpentine layout.

12. The device of claim 9, wherein the second layer comprises microelectronic devices.

13. The device of claim 12, wherein the microchannel comprises a closed loop system, wherein the microchannel is not coupled to a pump such that a pump does not cause the fluid to flow.

14. The device of claim 9, wherein the microchannel is partially filled with air.

15. The device of claim 9, wherein the first layer comprises a silicon layer, and wherein the second layer comprises a silicon dioxide layer.

16. The device of claim 9, wherein the first layer and the second layer comprise a silicon dioxide layer.

17. A device comprising:
   a first layer of a die, the first layer comprising a microchannel, wherein the microchannel is partially filled with a liquid and partially filled with air that creates a meniscus within the microchannel, and wherein the microchannel causes the meniscus to flow through the microchannel responsive to a temperature gradient created along the microchannel; and
   a second layer of the die bonded to the first layer, wherein the second layer bonded to the first layer prevents the liquid and the air fluid from moving out of and into the microchannel.

18. The device of claim 17, wherein the fluid comprises deionized water.

19. The device of claim 17, wherein the first layer comprises a silicon layer and the second layer comprises a silicon dioxide layer.

20. The device of claim 17, wherein the device includes a pump within the microchannel.

21. The device of claim 17, wherein the pump is activated in response to a detection of an increased temperature of the die.

* * * * *